US006983431B2

(12) United States Patent
Donelly et al.

(10) Patent No.: US 6,983,431 B2
(45) Date of Patent: Jan. 3, 2006

(54) SIMULTANEOUS PLACEMENT OF LARGE AND SMALL CELLS IN AN ELECTRONIC CIRCUIT

(75) Inventors: Ross A. Donelly, Sunnyvale, CA (US); William C. Naylor, San Jose, CA (US); Jason R. Woolever, Sunnyvale, CA (US)

(73) Assignee: Synopsys, Inc., Mountain View, CA (US)

(*) Notice: Subject to any disclaimer, the term of this patent is extended or adjusted under 35 U.S.C. 154(b) by 214 days.

(21) Appl. No.: 10/434,736

(22) Filed: May 9, 2003

(65) Prior Publication Data

US 2004/0225971 A1    Nov. 11, 2004

(51) Int. Cl.
*G06F 17/50*    (2006.01)

(52) U.S. Cl. .............. 716/2; 716/8; 716/9; 716/10; 716/11

(58) Field of Classification Search .......... 716/2, 716/8–14
See application file for complete search history.

(56) References Cited

U.S. PATENT DOCUMENTS

| | | | |
|---|---|---|---|
| 5,801,960 A * | 9/1998 | Takano et al. | 716/10 |
| 5,943,243 A * | 8/1999 | Sherlekar et al. | 716/9 |
| 6,625,792 B1 * | 9/2003 | Yamasaki | 716/11 |
| 2003/0084418 A1 * | 5/2003 | Regan | 716/14 |

* cited by examiner

*Primary Examiner*—Vuthe Siek
(74) *Attorney, Agent, or Firm*—Park, Vaughan & Fleming, LLP

(57) ABSTRACT

A method and system for the simultaneous placement of large and small cells in an electronic circuit. A coarse placement using well known methods may provide an initial placement of cells. Cells meeting a size criteria may be selected for further processing. An optimum cell orientation may be determined. An optimum axis of movement for separation may be determined. Overlapping cells may be separated and their positions may be optimized in both horizontal and vertical directions. Any cell moved from its initial placement may be fixed so as not to be moved during subsequent placements. This process may be repeated for cells meeting a new, generally smaller, size criteria. A well known detailed placement process may finalize a design. In this novel manner, large and small cells may be automatically simultaneously placed, deriving speed and quality advantages over prior art methods.

13 Claims, 9 Drawing Sheets

SIMULTANEOUS PLACEMENT OF LARGE AND SMALL CELLS IN AN ELECTRONIC CIRCUIT

FIELD OF THE INVENTION

Embodiments of the present invention relate to the field of electronic design automation (EDA). More particularly, embodiments of the present invention relate to techniques for cell placement and other optimizations used in the design and fabrication of integrated circuit devices.

BACKGROUND ART

The rapid growth of the complexity of modern electronic circuits has forced electronic circuit designers to rely upon computer programs to assist or automate most steps of the design process. Typical circuits today contain hundreds of thousands or millions of individual pieces or "cells." Such a design is much too large for a circuit designer or even an engineering team of designers to manage effectively manually. One of the most difficult, complex and time-consuming tasks in the design process is known as placement. The placement problem is the assignment of a collection of connected cells to positions in a 2-dimensional arena, such that objective functions such as total wire length are minimized.

Conventionally, both the X and Y coordinates of the cells are determined simultaneously. There are many well-known tools commercially available to accomplish this task, for example, the "Physical Compiler" by Synopsys of Mountain View, Calif. Modern chip design methods often involve combining both large design elements with smaller design elements. For example, a large element might be a random access memory, or RAM, which might be designed by an automated memory compiler. Other examples of large design elements include intellectual property blocks, or "IP blocks." Such IP blocks may implement complex functions, for example a processor core or a UART, which were designed previously and made available for integration into future designs.

The smallest design element is typically a cell, which may implement a basic logic function, for example a NAND gate. Such cells may be used to integrate existing IP or memory blocks together, and/or to implement new designs.

It is not unusual for a large element to be three to six orders of magnitude larger than the smallest elements. For example, it is not uncommon for a RAM block or cell to comprise a chip area equivalent to the area of 75,000 to 100,000 individual cells. Unfortunately, simultaneous placement of such large cells with numerous small cells has generally not been successful in prior art automatic placers. The prior art design process for a chip containing such large blocks or cells typically involves several stages of manual intervention to locate and fix in place such large cells, while removing illegal overlap conditions with many, perhaps thousands, of small cells. Such manual involvement in design processes may be described as more of an art than a science. Further, manual intervention generally lengthens the design duration, requires highly skilled people, and is inconsistent and generally not as optimized as a fully automated process.

Therefore, for these reasons and more, an automatic method of simultaneously placing both very large and very small electronic circuits elements is highly desirable. Such a method would have wide application in almost every area of integrated circuit application, including ASICs, systems on a chip (SOC), gate arrays and more.

SUMMARY OF THE INVENTION

Embodiments of the present invention enable the simultaneous placement of both large and small cells in an integrated circuit design. Further embodiments of the present invention may determine an optimal movement axis for separating overlapping cells. Still further embodiments of the present invention may determine an optimal rotation orientation for a cell.

A method and system for the simultaneous placement of large and small cells in an electronic circuit is disclosed. A coarse placement using well-known methods may provide an initial placement of cells. Cells meeting a size criteria may be selected for further processing. An optimum cell orientation may be determined. An optimum axis of movement for separation may be determined. Overlapping cells may be separated and their positions may be optimized in both horizontal and vertical directions. Any cell moved from its initial placement may be fixed so as not to be moved during subsequent placements. This process may be repeated for cells meeting a new, generally smaller, size criteria. A well known detailed placement process may finalize a design. In this novel manner, large and small cells may be automatically simultaneously placed, deriving speed and quality advantages over prior art methods.

DETAILED DESCRIPTION OF THE INVENTION

Figure 1:
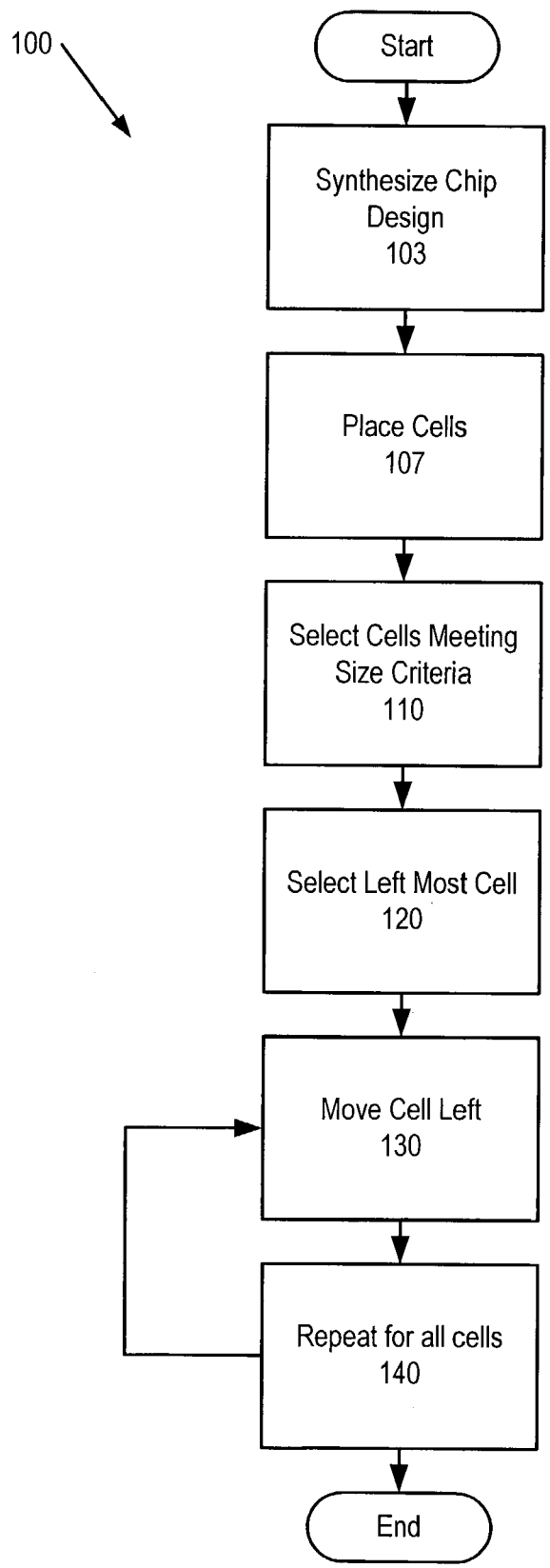
FIG. 1 is a flow diagram illustrating a method of removing overlap among cells of an integrated circuit, according to an embodiment of the present invention.

In the following detailed description of the present invention, simultaneous placement of large and small cells in an electronic circuit, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions which follow (e.g., processes 100, 200, 550, 800 and 900) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or "selecting" or "moving" or "repeating" or "combining" or "testing" of "setting" or "increasing" or "transforming" or "determining" or "optimizing" or "synthesizing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Simultaneous Placement of Large and Small Cells in an Electronic Circuit

The present invention is described in the context of the field of electronic design automation (EDA). More particularly, embodiments of the present invention relate to techniques for cell placement and other optimizations used in the design and fabrication of integrated circuit devices. It is appreciated, however, that elements of the present invention may be utilized in the design and fabrication of other types of circuits, for example printed wiring boards.

The functional design of an electronic integrated circuit specifies the cells (individual functional elements) that compose the circuit and which pins of which cells are to be connected together using wires ("nets"). Typically, much or all of the design of an integrated circuit is specified in a high level language, for example "HDL." Though a process of computer implemented synthesis, or "synthesizing," high level constructs are converted into cells and nets.

"Placement" or "placing" generally refers the important step of assigning a physical location, typically in two dimensions, in the process of physically implementing the electronic circuit, for example in an integrated circuit or on a printed wiring board. Reference is hereby made to U.S. Pat. No. 6,282,693, "Nonlinear Optimization System and Method for Wire Length and Density within an Automatic Electronic Circuit Placer," which is incorporated herein by reference in its entirety.

Reference is hereby made to U.S. Pat. No. 6,301,693, "Nonlinear Optimization System and Method for Wire Length and Delay Optimization for an Automatic Electronic Circuit Placer," which is incorporated herein by reference in its entirety.

FIG. 1 is a flow diagram illustrating a method 100 of removing overlap among cells of an integrated circuit, according to an embodiment of the present invention. Process 100 may begin with an initial placement containing overlapping cells. The initial placement may have been produced by any well known placement tool, including, for example, Physical Compiler, commercially available from Synopsys of California. In step 103, a high level language description of an integrated circuit design may be synthesized by techniques well known in the semiconductor industry. In step 107, the cells resulting from step 103 may be placed. This placement may be an initial placement, and the placement may not be "legal." For example, cells may overlap with other cells in such a manner that a functional chip could not be commercially viable to produce.

Figure 4A:
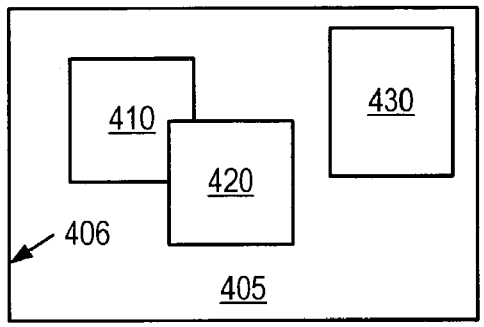
FIGS. 4A through 4E illustrate the movement of cells to be placed on an integrated circuit, according to embodiments of the present invention.

In optional step 110, only those cells meeting a size criteria, generally those cells of a given size or larger, may be selected for subsequent processing. FIG. 4A shows an integrated circuit die 405, with large cells 410, 420 and 430. Cells 410 and 420 overlay, and are therefore not in acceptable or legal positions.

In optional step 120, a cell closest to an edge of an integrated circuit may be chosen for movement. In this example, movement along a horizontal axis is 25 chosen, and "left" is chosen as the first direction of movement. It is appreciated that choosing "right" as the direction of first movement is well suited to embodiments of the present invention. It is further appreciated that movement along a vertical axis is well suited to embodiments of the present invention. Referring to FIG. 4A, consistent with the exemplary choices herein, cell 410 may be selected.

Figure 4B:
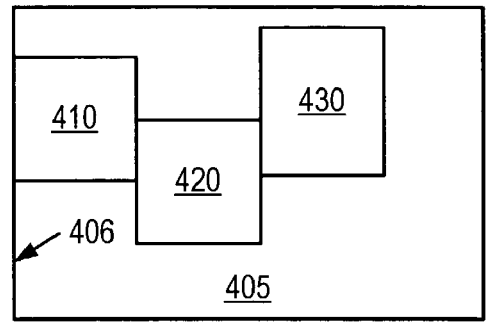

In step 130, the selected cell, for example cell 410 of FIG. 4A, may be moved in the chosen direction, for example to the left. The cell may be moved within the chip area, for example chip area 405 of FIG. 4A, until it abuts either a chip area edge, for example edge 406, or abuts another cell. In this exemplary case, cell 410 will eventually abut chip area edge 406, as shown in FIG. 4B.

In step 140, all cells are repetitively selected and moved in a similar fashion. This process may produce the cell arrangement of FIG. 4B. FIG. 4B shows a legal placement for all cells shown.

Figure 2:
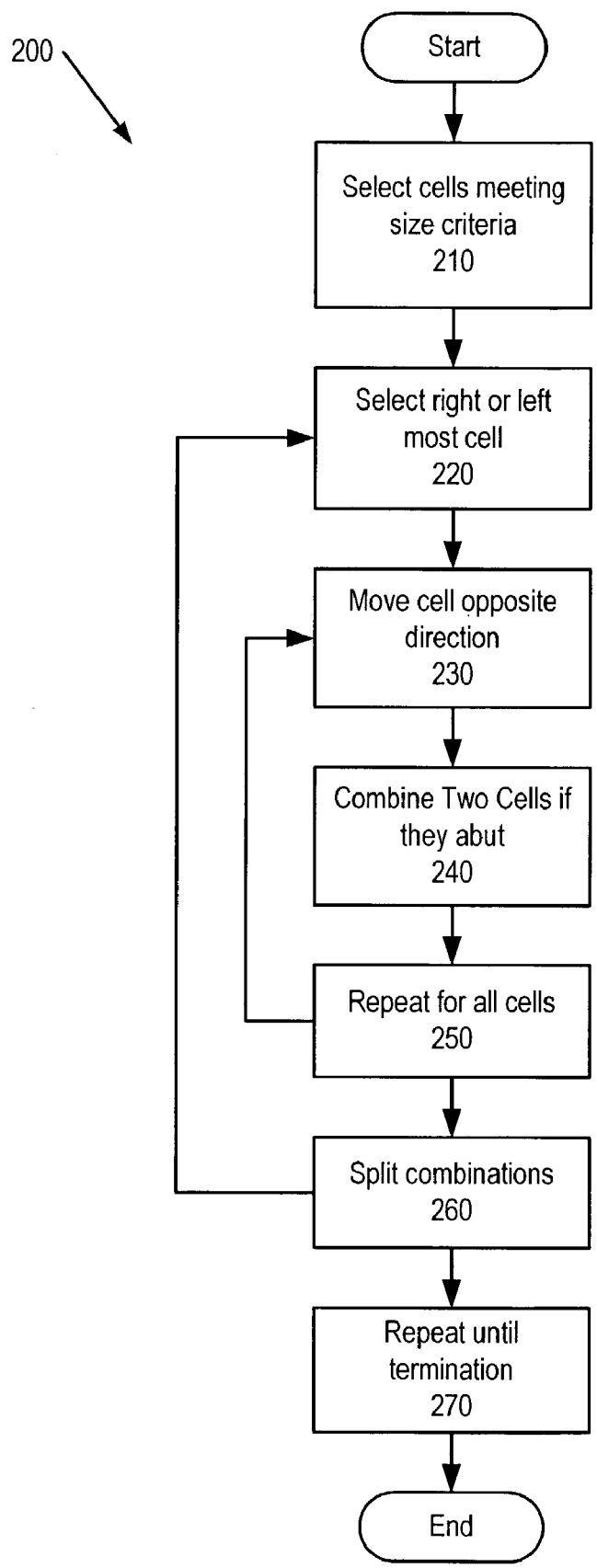
FIG. 2 illustrates a flow diagram of a method of optimizing a placement of cells of an integrated circuit, according to an embodiment of the present invention.

FIG. 2 illustrates a flow diagram of a method 200 of optimizing a placement of cells of an integrated circuit, according to an embodiment of the 20 present invention. The goals here include (1) creating a non-overlapping placement of cells and (2) minimizing the displacement of cells from their starting positions.

Figure 4C:
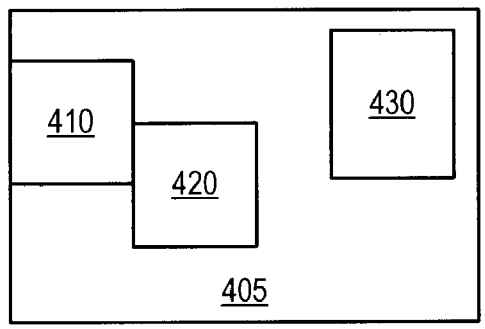

In optional step 210, only those cells meeting a size criteria, generally those cells of a given size or larger, may be selected for subsequent processing. FIG. 4C shows an integrated circuit die 405, with large cells 410, 25 420 and 430.

In optional step 220, a cell closest to an edge of an integrated circuit may be chosen for movement. In this example, movement along a horizontal axis is chosen, and "left" is chosen as the first direction of movement. It is appreciated that choosing "right" as the direction of first movement is well suited to embodiments of the present invention. It is further appreciated that movement along a vertical axis is well suited to embodiments of the present invention.

In optional step 220, the most recently moved cell may be chosen. If process 100 has just completed, the most recently moved cell may be cell 430 of FIG. 4B. In step 230, a chosen cell may be moved in the opposite direction of prior movement. In this example, process 100 moved cells to the left, consequently, right is the opposite direction. FIG. 4C shows that cell 430 has been moved to the right of its position in FIG. 4B. According to an embodiment of the present invention, the optimum position for such movement may be a cell's original position.

Figure 4D:
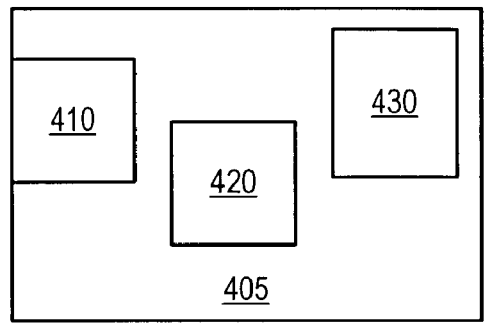

In optional step 250, this movement may be repeated for all selected cells. FIG. 4D shows that cells 420 and 430 have been moved to the right and returned to their original positions.

However, cell 410 may not be returned to its original position, since there 25 was originally overlaid with cell 420. In optional step 240, once a cell has reached the limit of its movement, in this example by abutting cell 420, the two abutting cells may be combined into a single combination cell.

Figure 4E:
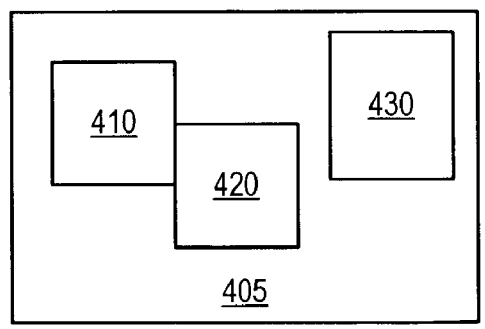

In a subsequent pass, step 230 may optionally move a combination cell so as to minimize the square of the displacement from the original position of the cell multiplied by the size of the cell, or another well known weighting factor, for example ranked size of the cell, for both cells which comprise the combination cell. This may result in the cell layout shown in FIG. 4E.

Figure 5A:
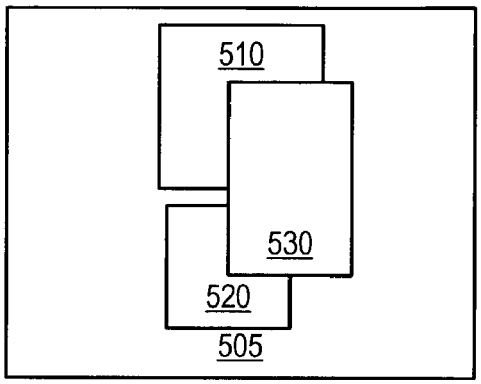
FIGS. 5A through 5F illustrate the movement of cells to be placed on an integrated circuit, according to embodiments of the present invention.
Figure 5B:
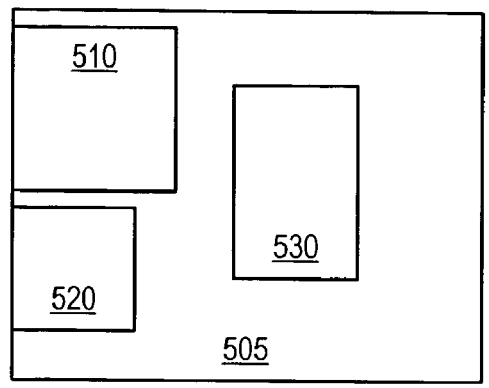

FIG. 5A shows an integrated circuit, or chip area 505, with cells 510, 520 and 530. FIG. 5B shows cells 510, 520 and 530 in an intermediate stage of process 100, with cells 510 and 520 adjacent to an edge of chip area 505.

Figure 5C:
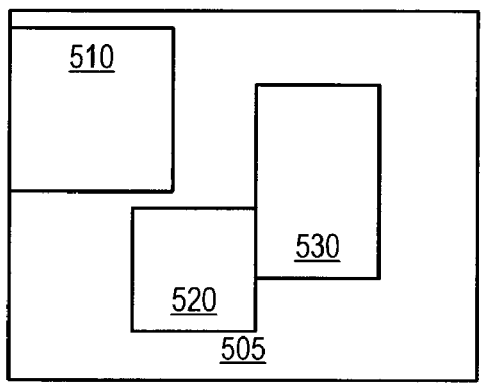
Figure 5D:
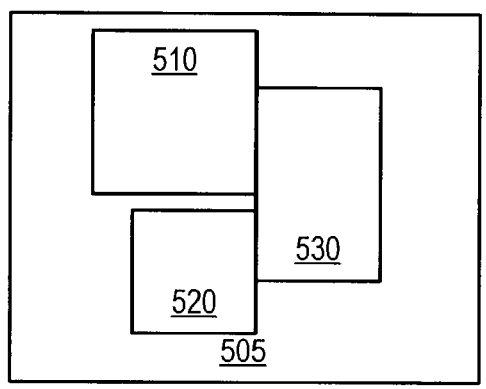
Figure 5E:
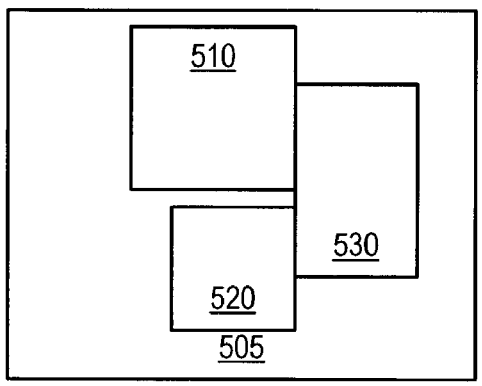

FIG. 5C shows that cell 520 has abutted cell 520. According to optional step 240 of process 200 in FIG. 2, these cells may be combined. FIG. 5E shows a similar movement and ultimate combination of cell 510 with the combined cells 520 and 530 to form a new combination cell.

It may occur that the best location for combination cell 510, 520 and 530 must be to the right of the best combination of cells 530 and 520. This may occur due to numerous factors, including for example the size of cell 510 or its displacement from an original position.

Figure 5F:
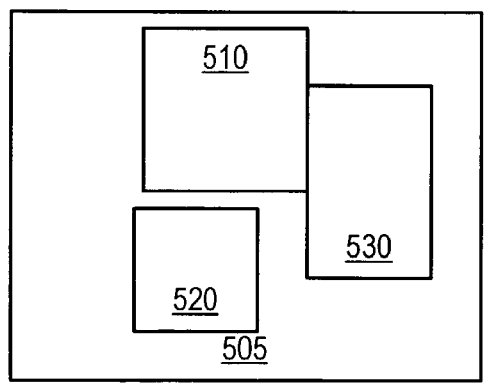

Referring once again to FIG. 2, in optional step 260, previously combined cells may be separated. FIG. 5F shows that cell 520 has been separated from the combination cell, and moved back to the left.

In optional step 270, process flow continues at step 220. The outer loop, branching from step 270 to step 220, may be repeated until a termination condition occurs, for example until no cells move or until a particular number of passes through the loop have occurred.

Figure 3:
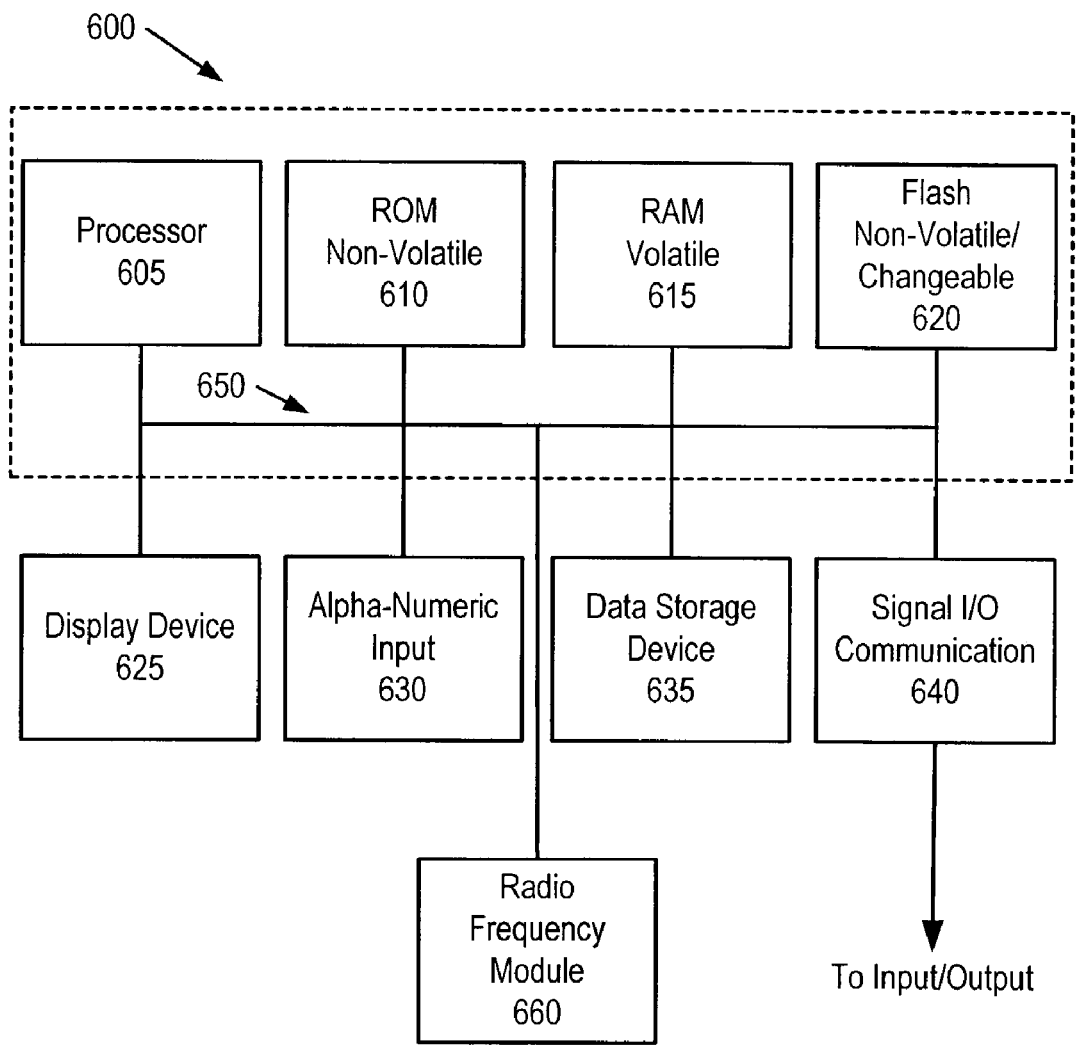
FIG. 3 illustrates circuitry of computer system 600, which may form a platform for the implementation of embodiments of the present invention.

FIG. 3 illustrates circuitry of computer system 600, which may form a platform for the implementation of embodiments of the present invention. Computer system 600 includes an address/data bus 650 for communicating information, a central processor 605 functionally coupled with the bus for processing information and instructions, a volatile memory 615 (e.g., random access memory RAM) coupled with the bus 650 for storing information and instructions for the central processor 605 and a non-volatile memory 610 (e.g., read only memory ROM) coupled with the bus 650 for storing static information and instructions for the processor 605. Computer system 600 also optionally includes a changeable, non-volatile memory 620 (e.g., flash) for storing information and instructions for the central processor 605, which can be updated after the manufacture of system 600.

Computer system 600 also optionally-includes a data storage device 635 (e.g., a rotating magnetic disk) coupled with the bus 650 for storing information 25and instructions.

Also included in computer system 600 of FIG. 3 is an optional alphanumeric input device 630. Device 630 can communicate information and command selections to the central processor 600. Device 630 may take the form of a touch sensitive digitizer panel or typewriter-style keyboard. Display device 625 utilized with the computer system 600 may be a liquid crystal display (LCD) device, cathode ray tube (CRT), field emission device (FED, also called flat panel CRT), light emitting diode (LED), plasma display device, electro-luminescent display, electronic paper or other display device suitable for creating graphic images and alphanumeric characters recognizable to the user. Optional signal input/output communication device 640 is also coupled to bus 650.

System 600 optionally includes a radio frequency module 660, which may implement a variety of wireless protocols, for example IEEE 802.11 or 15 Bluetooth.

Figure 6:
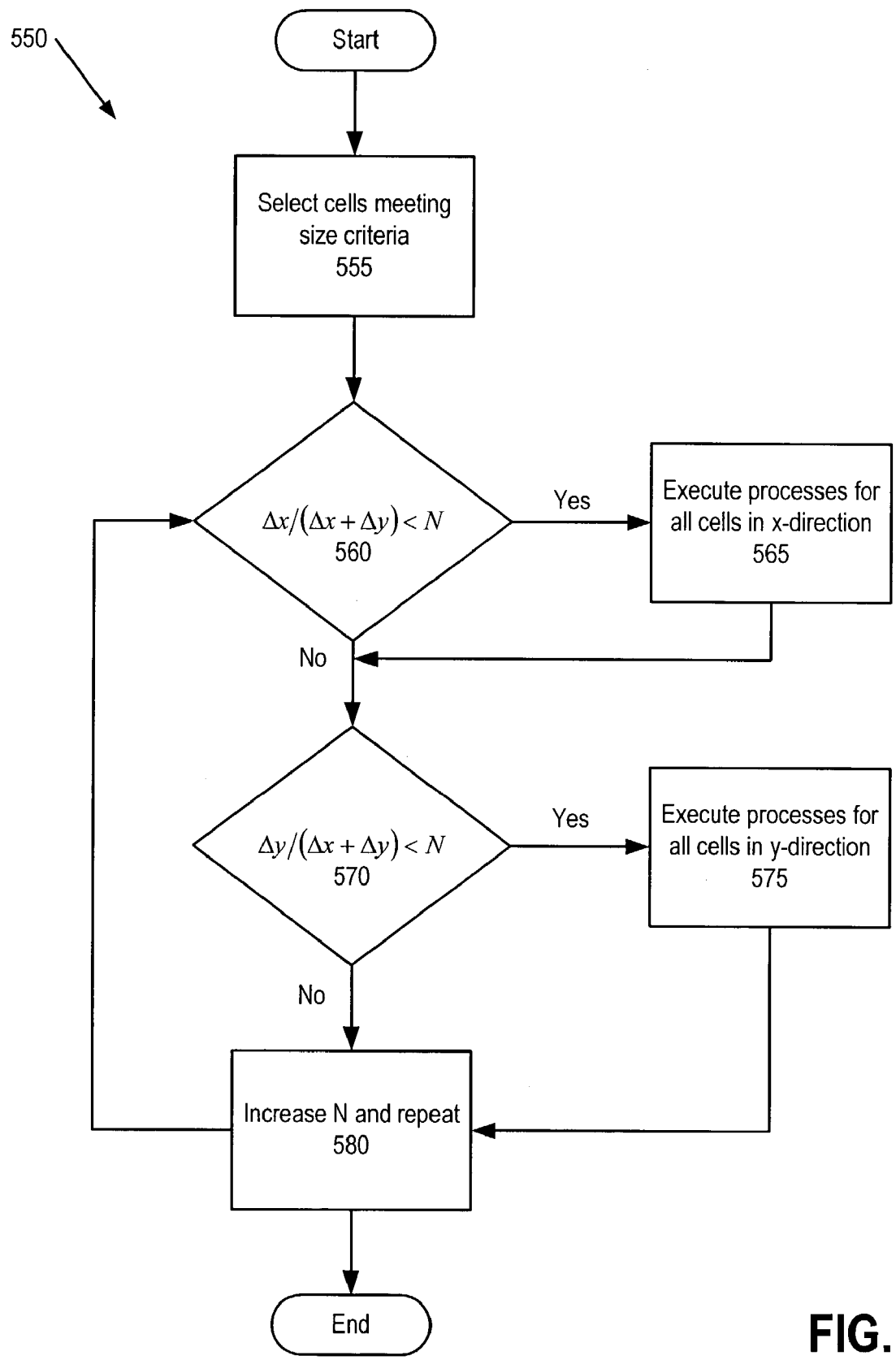
FIG. 6 illustrates a flow diagram of a process of determining a preferred axis of movement to remove overlap among cells of an integrated circuit, according to an embodiment of the present invention.

FIG. 6 illustrates a flow diagram of a process 550 of determining a preferred axis of movement to remove overlap among cells of an integrated circuit, according to an embodiment of the present invention.

In optional step 555, only those cells meeting a size criteria, generally those cells of a given size or larger, may be selected for subsequent processing. In step 560, the horizontal overlap between a first cell and a second cell may be compared to the sum of the horizontal overlap plus the vertical overlap between the two cells. If the ratio of the two values is less than a threshold, then step 565 may assign the horizontal axis as the preferred axis of separation to remove the overlap. Algebraically, this may be expressed as $\Delta x/(\Delta x+\Delta y)<N$. According to an embodiment of the present invention, step 565 may assign the horizontal axis as the preferred axis of separation for process 100.

In step 570, the vertical overlap between a first cell and a second cell may be compared to the sum of the horizontal overlap plus the vertical overlap between the two cells. If the ratio of the two values is less than a threshold, then step 575 may assign the vertical axis as the preferred axis of separation to remove the overlap. Algebraically, this may be expressed as $\Delta y/(\Delta x+\Delta y)<N$. According to an embodiment of the present invention, step 570 may assign the vertical axis as the preferred axis of separation for process 100.

Importantly, for a given value of "N," neither ratio test may be met, and no separation will be attempted for a pass of process 550 for that value of "N." Further, for some values of "N", for example N >0.5, embodiments of the present invention may remove, or attempt to remove, overlap along both the horizontal axis and the vertical axis.

In optional step 580, the value of "N" may be increased. Typically "N" may not exceed unity. Optional step 580 may also terminate process 550 if there are no overlaps.

Figure 7:
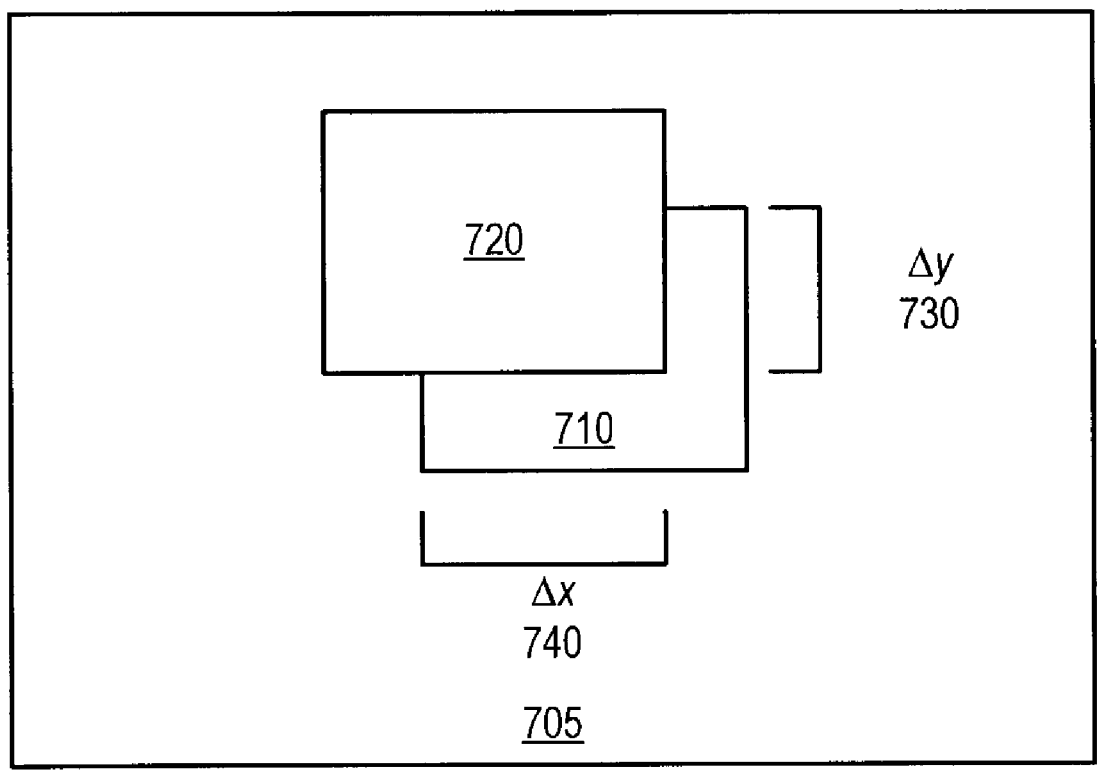
FIG. 7 illustrates overlap among two cells to be placed on an integrated circuit, according to embodiments of the present invention.

FIG. 7 illustrates a chip area 705 with overlapping cells 710 and 720. FIG. 7 further illustrates overlap in the horizontal dimension $\Delta x$ 740, and overlap in the vertical dimension $\Delta y$ 730.

Figure 8:
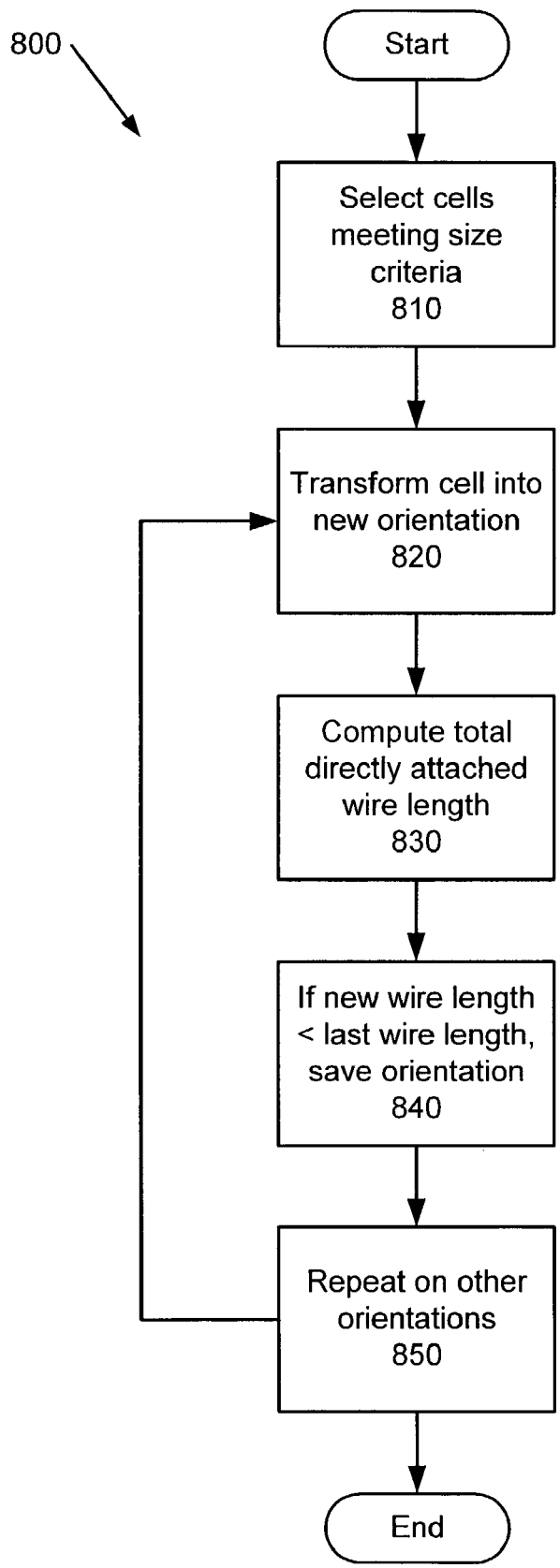
FIG. 8 illustrates a flow diagram of a method of flipping cells to determine an optimum orientation for placement in an integrated circuit, according to an embodiment of the present invention.

FIG. 8 illustrates a flow diagram of a method 800 of flipping cells to determine an optimum orientation for placement in an integrated circuit, according to an embodiment of the present invention.

In optional step 810, only those cells meeting a size criteria, generally those cells of a given size or larger, may be selected for subsequent processing.

In step 820, a selected cell may be transformed into a different orientation. In general, there are eight possible orientations, the original orientation plus rotations of 90 degrees, 180 degrees and 270 degrees, plus the mirror images of those four orientations.

In step 830, the total length of wires directly attached to the cell may be computed for a given orientation.

In step 840, if the total length of wires computed in step 820 is less than a previously computed total length of wires for a different orientation of the cell, then the new orientation may be chosen.

In step 850, the process is repeated for all eight possible orientations. Upon exit, the optimal orientation to minimize the total length of wires directly attached to a cell has been determined.

Figure 9:
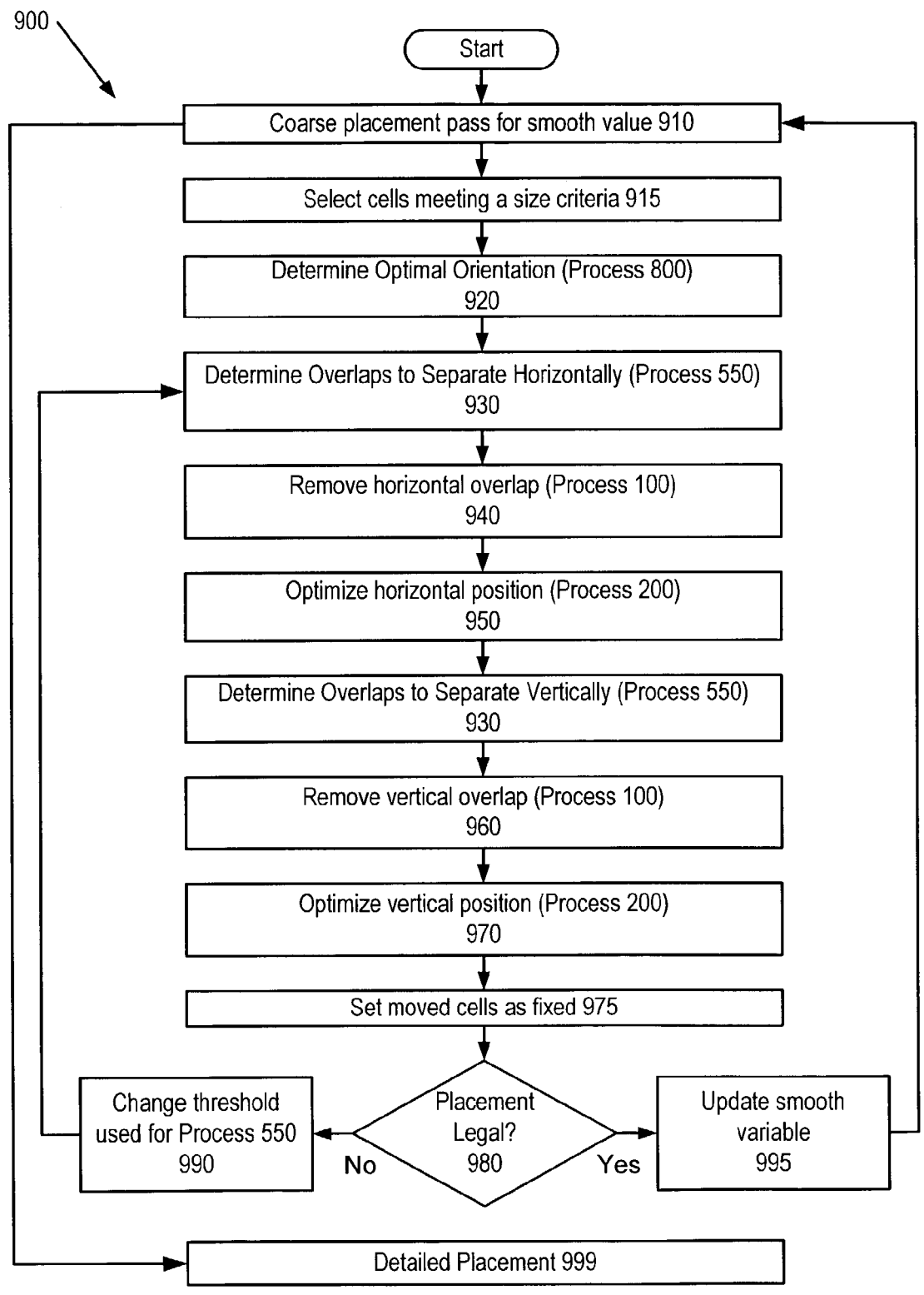
FIG. 9 illustrates a flow diagram describing a method for simultaneous placement of large and small cells in an electronic circuit, according to an embodiment of the present invention.

FIG. 9 illustrates a flow diagram describing a method 900 for 10 simultaneous placement of large and small cells in an electronic circuit, according to an embodiment of the present invention.

In step 910, an initial coarse placement may be produced by the methods described in U.S. Pat. No. 6,282,693 and U.S. Pat. No. 6,301,693. These Patents describe a "smooth variable", alpha, that may be used to alter the MOF, or master objective function, through multiple passes of the conjugate-gradient process where alpha is altered on each pass until the process terminates or convergence is reached. If the smooth variable has reached its terminal value, flow may continue at step 999 for detailed placement, which is a well known process. For non terminal values of the smooth variable, flow may continue to step 915.

In step 915, cells meeting a size criteria may be selected for further processing. The size criteria may be a multiple of the smooth variable alpha.

In step 920, an optimum cell orientation may be determined according to process 800.

In step 930, overlapping cells that should be separated horizontally may be determined by process 550. In step 940, overlapping cells may be separated horizontally via process 100. In step 950, the position of the separated cells may be optimized by process 200.

The methods of steps 930–950 may be replicated for the vertical axis. In step 955, overlapping cells that should be separated vertically may be determined by process 550. In step 960, overlapping cells may be separated vertically via process 100. In step 970, the position of the separated cells may be optimized by process 200.

In step 975, any cell which has been relocated, that is its position is different from that determined in step 910, may be fixed in place to prevent further movement.

There are 3 kinds of placement done alternately in process 900: coarse placement (step 910), overlap removal (steps 915 to 975), and detailed placement (step 999). Coarse placement and overlap removal alternate multiple times, then detailed placement is done once. It is important to note that when step 975 fixes a cell in place, this only affects coarse placement. It does not affect subsequent overlap removal or detailed placement. That is, the cell will not move again during coarse placement but it may move again during overlap removal and/or detailed placement. The purpose is to prevent the coarse placer from re-introducing the just removed overlap. The coarse placer saw merit (according to its own objective function) in overlapping the cells once, and will probably do so again if it is allowed to move the cells again.

In step 980, the placement of cells may be tested for legal placement. It is appreciated that a variety of well known legal placement tests are available. If the placement is legal, process flow may continue at step 995. Step 995 may update with a smooth variable. Process flow continues at step 910 where a new coarse placement may be produced with a different value of the smooth variable.

If the placement is not legal, flow continues at step 990. Step 990 may increase the threshold value for process 550 and transfer flow to step 930. The preferred embodiment of the present invention a system and method for simultaneous placement of large and small cells in an electronic circuit is thus described. While the present invention has been described in particular embodiments, it should be appreciated that the present invention should not be construed as limited by such embodiments, but rather construed according to the below claims.

What is claimed is:

1. A method of removing overlap among cells of an integrated circuit comprising:
   a) synthesizing a design of said integrated circuit;
   b) placing said cells within an integrated circuit area boundary;
   c) moving one of said cells in one direction of a linear dimension until said one of said cells abuts selectively an edge of said integrated circuit or another cell
   d) combining two of said cells which abut one another into a combination cell; and
   e) moving said combination cell so as to minimize the square of the displacement from the original position of a cell multiplied by the size of said cell for both cells which comprise said combination cell.

2. The method as described in claim 1 further comprising moving only cells meeting a cell size criteria.

3. The method as described in claim 2 further comprising repeating said a) for all cells meeting said cell size criteria.

4. The method as described in claim 3 further compromising beginning with a cell closest to said edge of said integrated circuit and proceeding in order along said linear dimension.

5. A method of optimizing a placement of cells of an integrated circuit comprising:
   a) moving one of said cells in one direction of a linear dimension, said direction being opposite of previous movement direction of said one of said cells:
   b) moving said one of said cells until selectively it is returned to its original position or it abuts selectively an edge of said integrated circuit or another cell;
   c) combining two of said cells which abut one another into a combination cell; and
   d) moving said combination cell so as to minimize the square of the displacement from the original position of a cell multiplied by the size of said cell for both cells which comprise said combination cell.

6. The method as described in claim 5 further comprising moving only cells meeting a cell size criteria.

7. The method as described in claim 6 further comprising repeating said a) for all cells meeting said cell size criteria.

8. The method as described in claim 7 further comprising beginning with a cell most recently moved in said previous movement direction.

9. The method as described in claim 8 further comprising separating combined cells and moving a separated cell to optimize an objective function.

10. A system comprising:
   a processor coupled to a bus;
   a memory coupled to said bus and wherein said memory contains instructions that when executed implement a method of removing overlap among cells of an integrated circuit, said method comprising the steps of:
   a) moving one of said cells in one direction of a linear dimension until said one of said cells abuts selectively an edge of said integrated circuit or another cell;
   b) moving one of said cells in one direction of a linear dimension, said direction being opposite of previous movement direction of said one of said cells;
   c) combining two of said cells which abut one another into a combination cell; and
   d) moving said combination cell so as to minimize the square of the displacement from the original position of a cell multiplied by the size of said cell for both cells which comprise said combination cell.

11. The system as described in claim 10 wherein said method further comprises moving only cells meeting a cell size criteria.

12. A computer usable medium having computer readable code stored thereon for causing a computer system to perform a method of removing overlap among cells of an integrated circuit, said method comprising:
   a) moving one of said cells in one direction of a linear dimension until said one of said cells abuts selectively an edge of said integrated circuit or another cell;
   b) moving one of said cells in one direction of a linear dimension, said direction being opposite of previous movement direction of said one of said cells;
   c) combining two of said cells which abut one another into a combination cell; and
   d) moving said combination cell so as to minimize the square of the displacement from the original position of a cell multiplied by the size of said cell for both cells which comprise said combination cell.

13. The computer usable medium as described in claim 12 wherein said method further comprises moving only cells meeting a cell size criteria.

* * * * *